United States Patent [19]

Benz

[11] Patent Number: 5,120,943

[45] Date of Patent: Jun. 9, 1992

[54] METHOD OF AND APPARATUS FOR SETTING A MEASURING INSTRUMENT

[75] Inventor: Reiner Benz, Kirchheim, Fed. Rep. of Germany

[73] Assignee: Wandel & Goltermann GmbH & Co., Eningen, Fed. Rep. of Germany

[21] Appl. No.: 539,986

[22] Filed: Jun. 18, 1990

[30] Foreign Application Priority Data

Jun. 19, 1989 [DE] Fed. Rep. of Germany ....... 3919886

[51] Int. Cl.⁵ .............................................. G06F 15/20
[52] U.S. Cl. .................................... 235/375; 235/462; 235/472; 364/559
[58] Field of Search ........................ 235/375, 462, 472; 364/559

[56] References Cited

U.S. PATENT DOCUMENTS 4,931,964 6/1990 Titsworth et al. .................. 364/559

FOREIGN PATENT DOCUMENTS 3602171 7/1987 Fed. Rep. of Germany.

OTHER PUBLICATIONS

Messen + Prüfen/Automatik, Jul./Aug. 1982, pp. 475, 476, 479–481.
Glückauf, No. 20, 1985, p. 1513.
De-Buch: Gosman, K-H: Anwenderhandbuch HP-41C/CV, Friedrich Vieweg & Sohn Verlaqseqesellschaft mbH, Braunschweig, 1983, pp. 118–121, 130, 131.
Enclosed: Copy of Communication from W. German Patent Office listing the 4 above publications.

*Primary Examiner*—Harold Pitts
*Attorney, Agent, or Firm*—Herbert Dubno

[57] ABSTRACT

An electronic measuring instrument capable of receiving control signals for setting same, is set by a bar-code reader through an encoder and processor utilizing setting instructions printed in bar-code form, so that the instruction set is accurately transferred to the microprocessor generating the control signals.

8 Claims, 3 Drawing Sheets

METHOD OF AND APPARATUS FOR SETTING A MEASURING INSTRUMENT

FIELD OF THE INVENTION

My present invention relates to an apparatus for setting a measuring instrument, especially for the setting of a measuring instrument capable of carrying out various measurements, like level measurements, attenuation measurements or the like, and which is settable by means of electronic control signals to a desired measurement type and with predetermined measurement prescriptions and in which a processor, usually a microprocessor, is provided which is set in dependence upon the control signals to the desired measurement instruments. The invention also relates to a method of setting such an instrument.

The invention relates, as well, to an improved, highly versatile multimode or multifunctional electronic measuring instrument with greater versatility of setting.

BACKGROUND OF THE INVENTION

For carrying out a setup of measurement instruments and to satisfy the need for a series of measurements in accordance with predetermined instruments, multimode or multifunctional electronic measuring instruments can be provided and must be set with respect to the measurement type or mode and the measurement sensitivity or range.

For complex measurements, the setting of measuring instruments requires a comparatively large number of setting steps which must be meticulously followed to ensure a precise measurement and in which no step can be omitted or can be permitted to contain a setting error.

In quality control of electronic devices or apparatus or the measurements relevant to communications transmission paths or systems, repetitious standardized measurements must be carried out which require the use of a measuring device having multimode, multirange and a range of sensitivities as characteristics. With conventional measuring devices of this type, e.g. for measuring levels of signals, attenuation and the like, the setting must be made by an operator with a high degree of concentration and in a time-consuming manner to set up the measuring instruments for the desired series of measurements and in accordance with the measurement requirements or instructions.

Measuring devices of this type also generally have a remote control input to which a computer can be connected for setting various measurement instruments. However, computer connections for this purpose are very costly and are generally used only in special purpose applications.

OBJECTS OF THE INVENTION

It is, therefore, the principal object of the present invention to provide a device for setting a measuring instrument for carrying out different measurement instructions, whereby the setting is made as simple as possible and as reliable as possible.

Another object of the invention is to provide a method of setting an electronic measuring instrument having complex settings in a simple and rapid manner and with the high reliability required for precise measurements, especially for carrying out a large number of equal measurements in the quality control of electronic devices or in the maintenance of communications systems.

Still another object of the invention is to provide an improved electronic measuring instrument for the purposes described, whereby drawbacks of prior art devices are avoided.

SUMMARY OF THE INVENTION

These objects and others which will become apparent hereinafter are attained, in accordance with the invention, in a device for the setting of a measuring instrument, especially a multimode or multifunctional instrument having a variety of ranges and/or sensitivities, for carrying out various measurements, like level measurements and attenuation measurements, e.g. on electronic devices or in communication lines and which is settable by means of electrical control signals to a desired measurement type, mode or function and in accordance with predetermined measurement prescriptions and in which a processor, especially a microprocessor, is provided which can be set by control signals to the desired measurement instruments.

According to the invention, a bar-code reader is provided which transfers to the input of an encoder a bar code previously provided, e.g. on a setting sheet or instruction sheet for the instrument, and created to provide the setting instructions required for any particular set of measurements which the instrument may be required to carry out, both with respect to mode selections or function selections and with respect to the selected range and/or sensitivity.

The encoder, in turn, transforms the read signals into digitally coded information which is supplied to the processor. The processor converts this coded information into setting data and setting commands.

According to an important feature of the invention, the processor is connected to a configuration memory from which system-specific information can be read. The processor then generates the requisite control signals for the desired measurement instructions from these setting data and setting commands in the presence of the system's specific information read from the memory.

Because the basic input to the setting device of the invention is obtained by a bar-code reader and is in the form of a bar code, it is read in an error-free manner so that a processor on the basis of the read setting information can generate the control signals for setting the measuring instruments and thus effect all of the requisite setting steps.

As a result, the setting is effected rapidly, reliably, conveniently and at low cost and can be used effectively for the repetitive setting of measuring instruments with respect to an unlimited number of patterns.

For each measurement instruction or instruction set, the operator can be provided with a master sheet containing a pattern of the requisite bar code for that instrument set. The set patterns in the bar code form can be generated by commercially-available printers in a very simple manner utilizing any commercial bar-code generating program.

For the setting of measuring instruments for repeated instrument sets in plant operations, in control, repair, quality monitoring and communications systems, standard setting patterns can be used and supplied to the monitoring and repair personnel to be certain of fail-safe setting of the instruments.

The operator need only select properly the specific bar code which is applicable to the instrument set or select specific bar codes one after the other with the bar-code reader to set the measuring instrument.

The bar code may contain an alphanumeric sequence providing directions and data for carrying out the setting of the measuring instrument. It can, in addition, contain commands which effect instrument operations, for example, a reset command for resetting the measurement instruments after a particular measuring operation.

It has been found to be advantageous, in accordance with a feature of the invention, to transfer the digital information generated from the bar code into an intermediate memory which makes that information available after a time lag with a time offset and which can provide that information if desired, for repetitive settings of the measuring instrument as may be required. Thus, once the setting information is read from the bar code into the intermediate memory, it can be stored there for use in setting the instrument for a number of measurements without requiring rereading of the bar code for such successive measurements.

The measuring device can be provided with a reading and control unit which can be connected to a remote control unit of the measuring instrument. The reading and control unit generates the requisite control signals in dependence upon the read bar-code information so that the use of the reading and control unit is possible for commercially available measuring instruments having remote control inputs, using a bar-code setting pattern for the different measurement instruments. A separate processor provided in the reading and control unit in that case can generate the requisite control signals delivered to the remote control input for setting the instrument.

According to another aspect of the invention, a method of setting a measuring instrument which can be set by control signals comprises the steps of initially printing bar codes with setting information for the instrument, reading selected printed bar codes with a bar-code reader and converting the bar-code information into electrical-control signals and setting the measuring instrument to the desired measurement instructions utilizing these electrical-control signals. The bar-code operations can be generated in a simple manner by means of a personal computer or the like and a printer, especially a laser printer, connected thereto.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
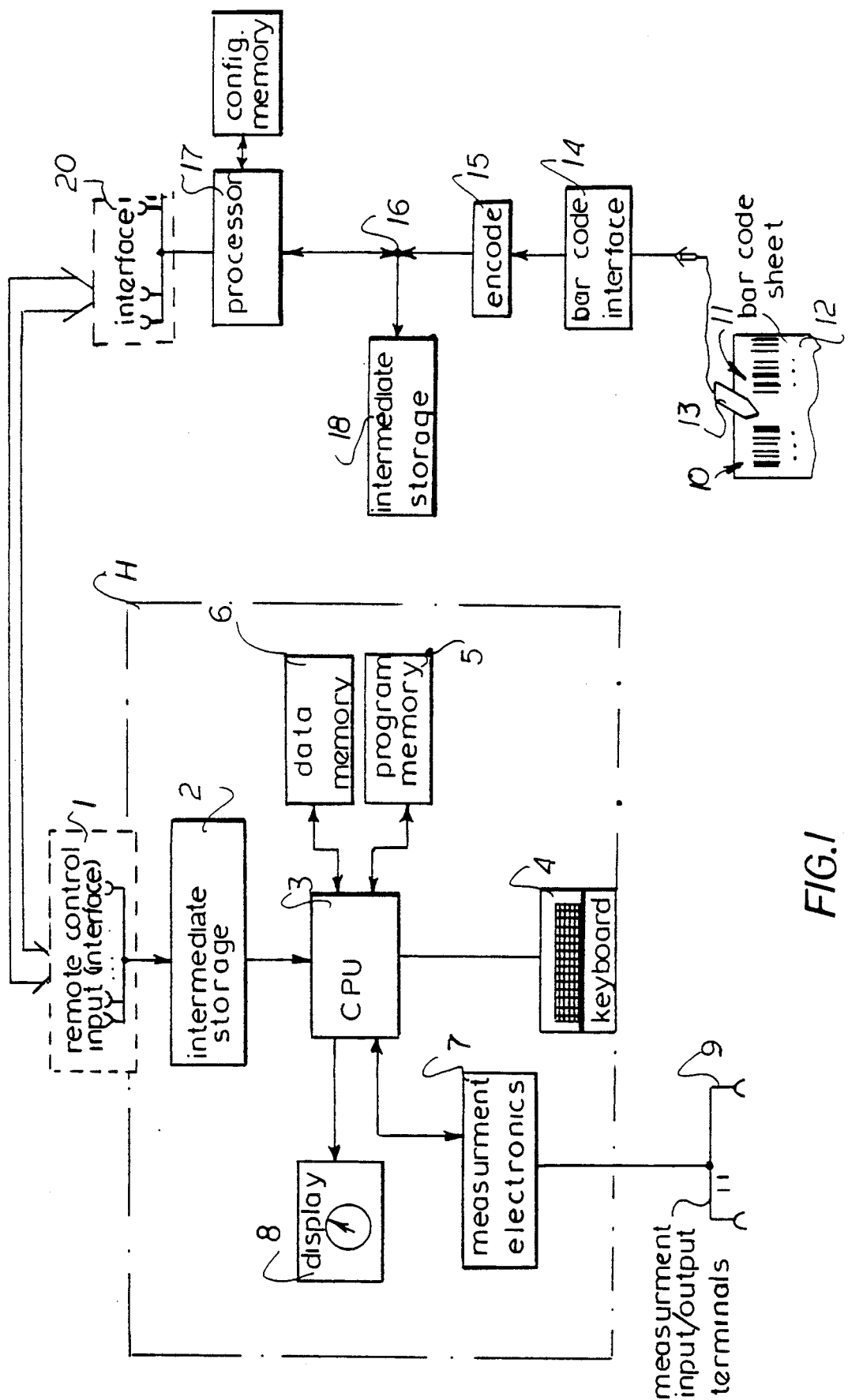
FIG. 1 is a block diagram of a measuring instrument having a reading and control unit connected to a remote-control input thereof.

The block diagram of FIG. 1 illustrates at its left-hand side a commercially-available measuring instrument provided with a remote-control input or interface 1 which can be a standard measuring instrument interface of IEEE 488 or IEC 625 type. The remote-control input 1 is connected to an intermediate memory 2 and a processor 3 which can be the central processing unit of the instrument. The housing of the instrument is represented by the dot-dash line H.

The processor 3 is connected, as is customary in such instruments, with a keyboard 4 serving for manual setting and programming of the instrument, a program memory 5 and a data memory 6 via the usual buses.

In addition, the measuring electronic circuitry 7 and a display device 8 can be connected to the processor 3. The measuring electronics 7 can carry out the particular measurements required utilizing measurement input and output terminals 9 which can be connected to the electronic device under test, the measurement data being shown on the display 8.

The keyboard 4 can input the measurements to be made by the instrument to the processor in the form of alphanumeric information. The interpretation of this information and the effectuation of the measurement programs in response thereto is ensured by analysis in the processor 3 which can tap the program memory 5 and the data memory 6 for the particular program and sensitivity information or range information required.

For example, if a measurement signal of an amplitude of about 30 mV is to be generated, this can be established as the output of the instrument by the inputting of the information "M30".

Further specifications as to the measurement instruments to be carried out can also be inputted, for example, details as to the timing relationship of signals, sensitivity of the measurement inputs and sequences of all instruments can be provided in a list of instructions which can be inputted by an operator utilizing the keyboard 4. 10 According to the present invention, corresponding instructions are provided as bar codes 10 and 11, for example, printed on a paper sheet or strip 12 which can be used as a master pattern for setting this instrument or any instrument provided with similar capabilities and equipped with a bar code reader.

The bar code reader in the embodiment shown in FIG. 1 comprises a reading pencil or stylus 13, cooperating with a bar-code interfacing unit 14 of conventional design. The bar-code reader 13, 14, can convert a bar code scanned by the reading stylus into corresponding electrical read signals.

The read signals are supplied to an encoder 15 which encodes these signals in a digital form and provides with its output 16 corresponding digitally-coded information.

This digitally-coded information is supplied here to a separate processor 17 and to an intermediate memory 18. The coded information is processed in the processor 17 and gives rise to a change in the information in response to the configuration information contained in the configuration memory 19 or generates directly in the processor 17 setting command and setting data which, together with system-specific information drawn from the configuration memory 19 is transformed within the processor into control signals for the measurement instrument. The data output interface 20 of the processor 17 is connected to the remote control input 1 of the instrument. The processor 17 thus delivers to the processor 3 of the instrument the control signals necessary for setting the instrument and modifying the action of the measurement electronics in accordance with the information read to the processor 17 from the bar-code master sheet.

Figure 2:
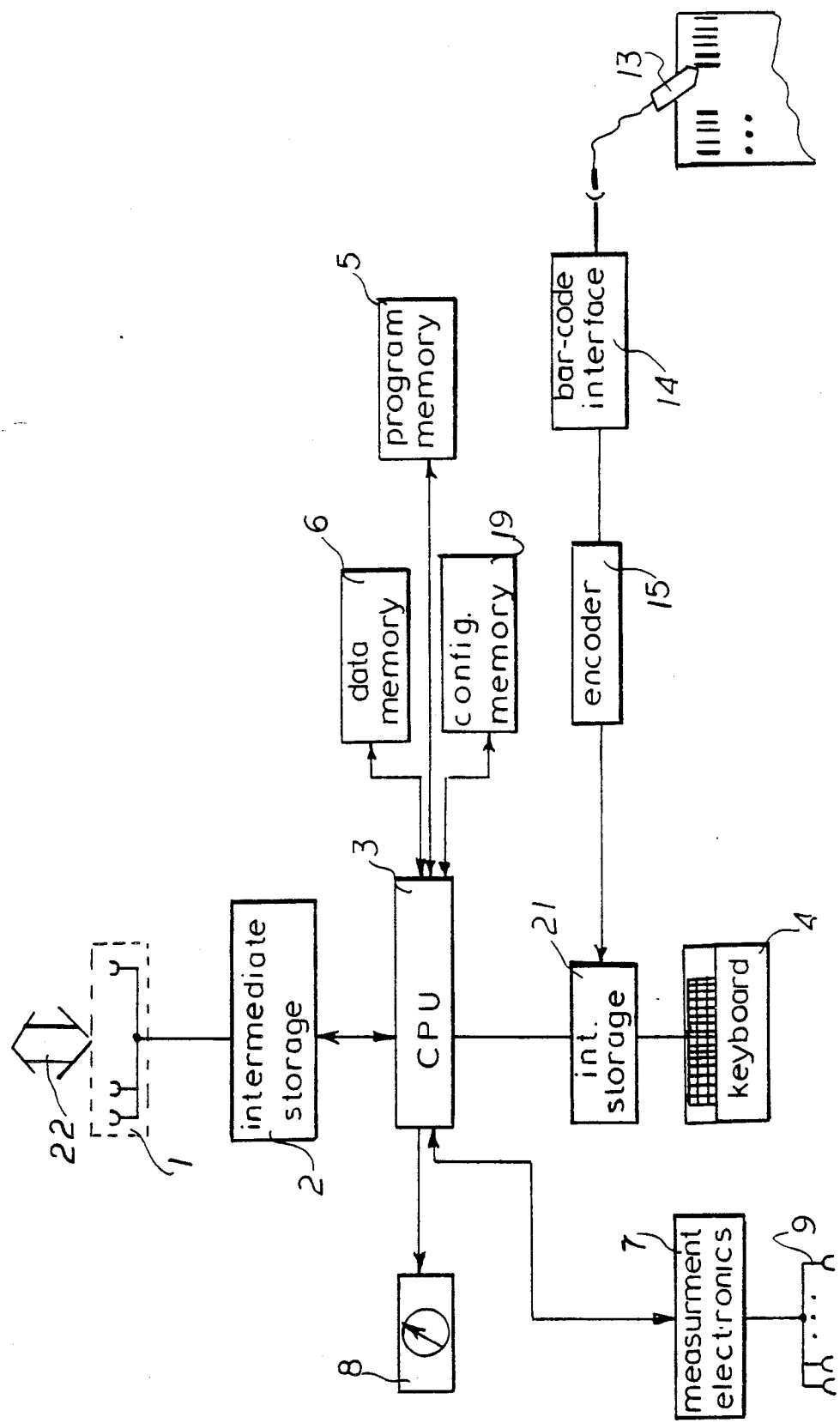
FIG. 2 is a block diagram of a measuring instrument in which the bar-code information is converted internally for setting the instrument within the internal circuitry thereof.

In the embodiment of FIG. 2, the configuration memory 19 is in direct connection with the processor 3.

The bar-code reader, comprised of the reading stylus 13 and the bar-code interface 14, in this embodiment delivers the read information via the encoder 15 to the intermittent memory 21 which can receive information as well from the keyboard 4.

The information contained in the intermediate storage 21 can be read out by the processor 3 so that the processor 3 can reconfigure the measurement electronics for the desired measurement instruments based upon the information contained in the configuration memory 19 in conjunction with the bar-code instruction.

In the embodiment of FIG. 2, the remote control input 1 is not connected although it is possible to connect it to a data bus 22 for data exchange between the instrument and remote devices independently of the bar-code reader.

Figure 3:
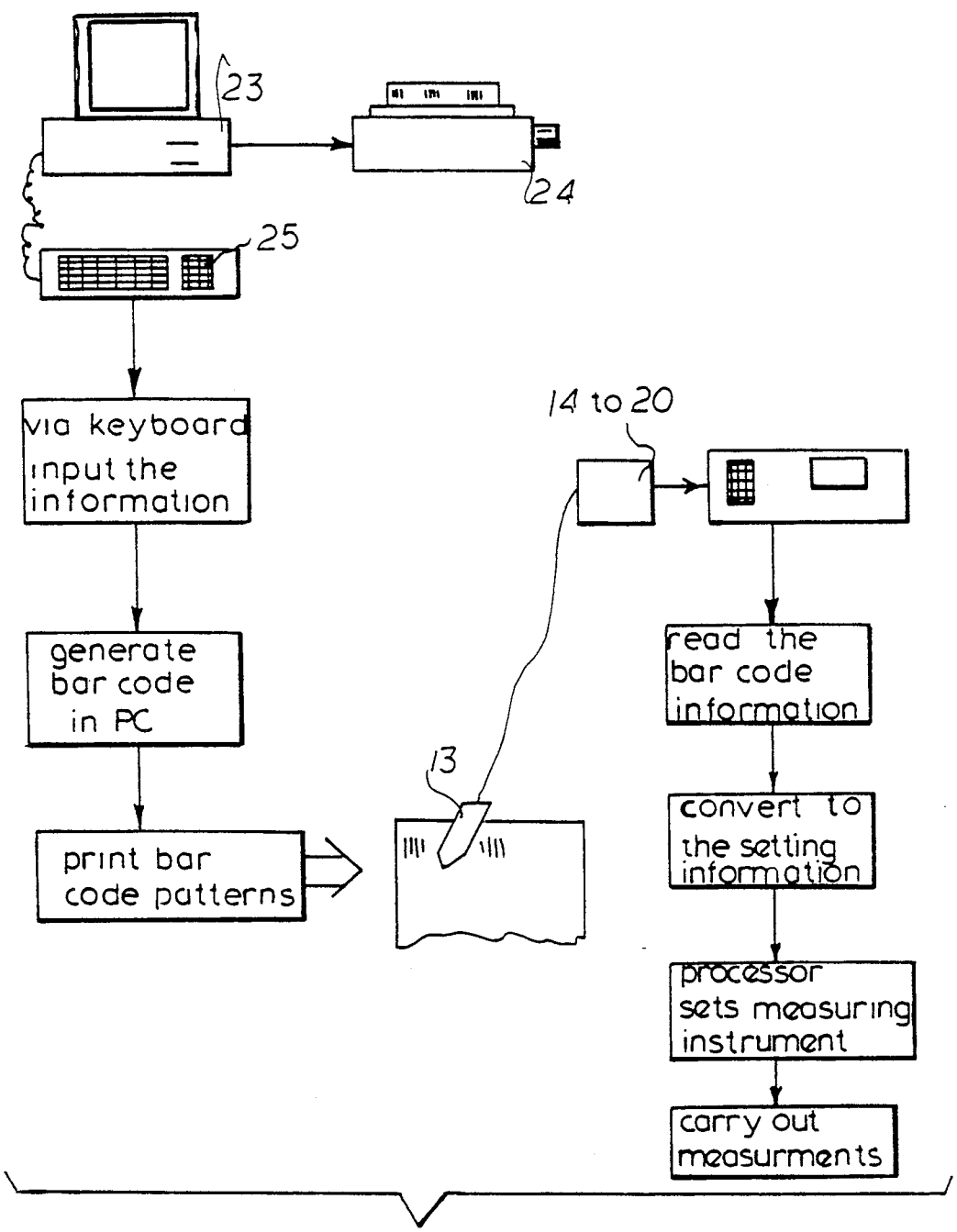
FIG. 3 is a diagram illustrating the algorithm for setting the measuring instrument and generating the setting patterns with bar codes.

FIG. 3 is a diagram which shows the sequence of patterns in the preparation of a bar-code master and the setting of a measuring instrument utilizing the bar-code patterns.

Using a personal computer 23 and a standard printer, for example, a laser printer 24 and an appropriate coding program for translating alphanumerical information into bar-code patterns, the bar-code patterns are produced.

For this purpose, the keyboard 25 inputs a number of setting steps in the form of alphanumeric instructions to the computer 23. The instruction set can comprise, for example, the instructions MA11, P121, STA.

The program contained in the personal computer, based upon this alphanumeric information generates a corresponding number of bar codes. In the next step these bar codes are printed at 24 on a sheet 26.

To set the measuring device based upon the selected measurement instructions, the appropriate bar code from the master sheet 26 can be read with the stylus 13 and transformed into the digitally-coded information as the sequence of operations at the right-hand side of FIG. 3 shows. This digitally-coded information is directly supplied to the instrument in accordance with FIG. 2 or is delivered to the instrument from a separate processor as described in connection with FIG. 1. The processor, therefore, sets the measuring instrument corresponding to this digital information and hence the desired measurement instructions so that the measurement can be carried out.

For different sets of measurement instructions, different master sheets 26 can be used and it is possible to supply the user with only the master sheet required for a particular set of instructions and thereby practically exclude any errors in setting by ensuring that the operator will have only the specific bar-code patterns required for particular measurement instruction sets before him, or her.

I claim:

1. A device for setting a selected measuring instrument of a communications system having measuring electronics electronically settable selectively for multifunctional and multivalue measurements, comprising:
   a set of instrument-setting instructions in bar code patterns;
   a bar-code reader adapted to read said patterns and generate an output representing a read bar-code pattern;
   an encoder connected to said bar code reader for transforming said signals representing said read bar-code pattern into digitally coded signals corresponding to setting instructions;
   a setting processor connected to said encoder and receiving said digitally-coded signals for converting information contained in said digitally-coded signals into setting data and setting commands;
   a configuration memory connected to said setting processor and from which said setting processor can read system-specific information, said setting processor generating said control signals and applying said control signals to said measurement electronics from said setting data and said setting commands and the presence of system-specific information read from said configuration memory, thereby setting said instrument in response to at least one read bar-code pattern, said instrument comprising an internal processor separate from said setting processor and said first-mentioned processor is provided in a reading and control device having an output interface connected to a remote-control input of said measuring instrument for generating control signals required for setting the measurement instrument, said setting processor being connected with said encoder, said intermediate memory and said configuration memory and having an output connected to said output interface delivering the control signals and communicating with said remote-control input.

2. The device defined in claim 1 wherein said processor converts said digitally-coded signal into addresses of the configuration memory and said configuration memory stores the setting commands and setting data as well as said system-specific information.

3. The device defined in claim 1, further comprising an intermediate memory connected with said processor and receiving coded digital information therefrom representing at least in part said digital signals.

4. An electronic measuring instrument assembly for a communications system, comprising:
   at least one electronic measuring instrument provided with measuring electronics electronically settable selectively for multifunctional and multivalue measurements and having a standardized remote-control input; and
   a setting instrument connected to said measuring instrument and comprising:
      a bar-code reader adapted to receive bar-code patterns preprinted in accordance with instrument-setting instructions and generating upon reading a respective bar-code pattern, an output representing the read bar-code pattern,
      an encoder connected to said bar code reader for transforming said signals representing said read bar-code pattern into digitally coded signals corresponding to setting instructions,
      a processor connected to said encoder and receiving said digitally-coded signals for converting information contained in said digitally-coded signals into setting data and setting commands,
      a configuration memory connected to said processor and from which said processor can read system-specific information, said processor generating said control signals and applying said control signals to said measurement electronics from said setting data and said setting commands and the presence of system-specific information read from said configuration memory, thereby setting said measuring instrument in response to at least one read bar-code pattern, said processor converting said digitally-coded signal into addresses of the configuration memory and said configuration memory storing the setting commands and setting data as well as said system-specific information, an intermediate memory connected with said processor and receiving coded digital information therefrom representing at least in part said digital signals, and an output interface connected with said processor for receiving said control signals and connected to said standardized remote-control input for delivering said control signals thereto.

5. The electronic measuring instrument defined in claim 4 wherein said measuring instrument comprises an internal processor separate from said first-mentioned processor.

6. A method of setting a measuring instrument of a communications system to a selected one of predetermined measurement instruments, for the setting of a measurement mode or function, sensitivity or range, comprising the steps of:

(a) initially printing said setting information in the form of bar-code patterns on a sheet;

(b) reading said bar-code patterns from said sheet to produce output signals representing said bar-code patterns;

(c) converting said signals into digitally-coded information representing said instructions; and (d) generating control signals from said digitally-coded information by storing system-specific configuration data in a configuration memory and reading said system-specific information from said memory in response to said digitally-coded information in forming said control signals and communicating said control signals to said measuring instrument through a standardized remote-control interface thereof for automatically setting said instrument with said control signals.

7. The method defined in claim 6, further comprising the step of storing said digitally-coded information in an intermediate memory prior to using it to set said instrument.

8. A device for setting a selected measuring instrument of a communications system having measuring electronics electronically settable selectively for multifunctional and multivalue measurements, comprising:

a set of instrument-setting instructions in bar code patterns;

a bar-code reader adapted to read said patterns and generate an output representing a read bar-code pattern;

an encoder connected to said bar code reader for transforming said signals representing said read bar-code pattern into digitally coded signals corresponding to setting instructions;

a setting processor connected to said encoder and receiving said digitally-coded signals for converting information contained in said digitally-coded signals into setting data and setting commands;

a configuration memory connected to said setting processor and from which said setting processor can read system-specific information, said setting processor generating said control signals and applying said control signals to said measurement electronics from said setting data and said setting commands and the presence of system-specific information read from said configuration memory, thereby setting said instrument in response to at least one read bar-code pattern, said instrument comprising an internal processor separate from said setting processor and said first-mentioned processor is provided in a reading and control device having an output interface connected to a remote-control input of said measuring instrument for generating control signals required for setting the measurement instrument, said setting processor being connected with said encoder, said intermediate memory and said configuration memory and having an output connected to said output interface delivering the control signals and communicating with said remote-control input.

* * * * *